United States Patent
Shigyo et al.

(10) Patent No.: US 8,564,649 B2
(45) Date of Patent: Oct. 22, 2013

(54) SHUTTER DRIVE UNIT AND THREE DIMENSIONAL IMAGE DISPLAY SYSTEM

(75) Inventors: Nobuhiko Shigyo, Fukuoka (JP); Toshio Suzuki, Kanagawa (JP); Koichi Hashikaki, Nagasaki (JP); Seigou Sakai, Nagasaki (JP)

(73) Assignee: Sony Corporation, Tokyo (JP)

( * ) Notice: Subject to any disclaimer, the term of this patent is extended or adjusted under 35 U.S.C. 154(b) by 518 days.

(21) Appl. No.: 12/805,465

(22) Filed: Aug. 2, 2010

(65) Prior Publication Data
US 2011/0050868 A1 Mar. 3, 2011

(30) Foreign Application Priority Data
Sep. 2, 2009 (JP) ................. 2009-203130

(51) Int. Cl.
*H04N 13/04* (2006.01)
*H04N 13/02* (2006.01)
(52) U.S. Cl.
USPC ............................... 348/56; 348/42; 359/464
(58) Field of Classification Search
None
See application file for complete search history.

(56) References Cited

U.S. PATENT DOCUMENTS 5,821,989 A * 10/1998 Lazzaro et al. ................. 348/56
2010/0157031 A1 * 6/2010 MacNaughton et al. ....... 348/56

* cited by examiner

*Primary Examiner* — Christopher S Kelley
*Assistant Examiner* — Deirdre Beasley
(74) *Attorney, Agent, or Firm* — Rader, Fishman & Grauer PLLC

(57) ABSTRACT

Disclosed herein is a shutter drive unit, including: at least one inductor; first and second drive paths; first and second shutter including first and second drive object capacitive loads, respectively; first and second clamping circuits adapted to clamp the first and second drive object capacitive loads either to a power source potential or to a reference potential through the first and second drive paths, respectively; a first switch adapted to switch connection and non-connection between the inductor and the first drive object capacitive load over to each other; a second switch adapted to switch connection and non-connection between the inductor and the second drive object capacitive load over to each other; and a power collecting portion having a function of applying an intermediate voltage between the power source potential and the reference potential to the inductor, and a power collecting function of collecting a power by the inductor.

16 Claims, 11 Drawing Sheets

F I G . 2
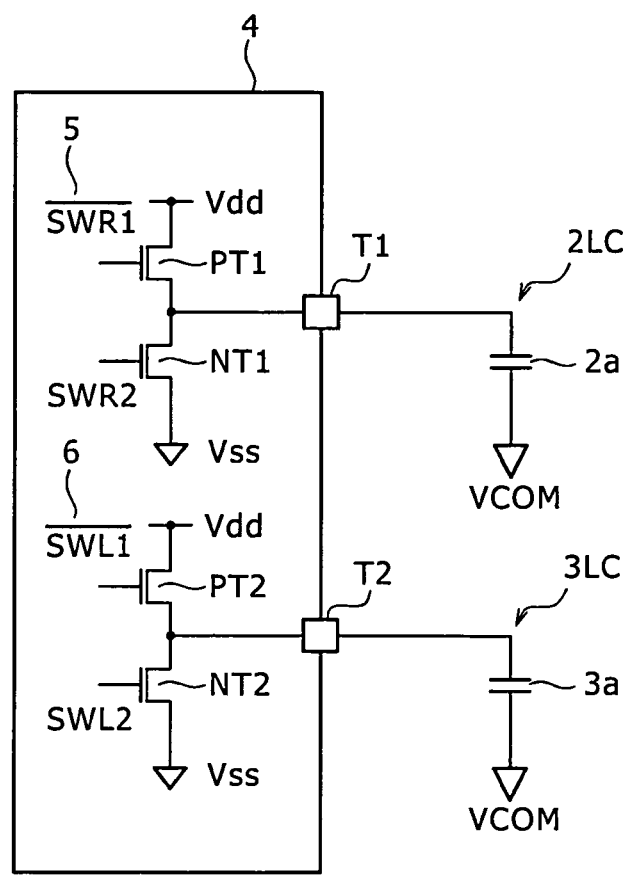

SHUTTER DRIVE UNIT AND THREE DIMENSIONAL IMAGE DISPLAY SYSTEM

BACKGROUND OF THE INVENTION

1. Field of the Invention

The present invention relates to a shutter drive unit for causing a three-dimensional (3D) stereoscopic image to be expressed by driving shutters of 3D eyeglasses, and a 3D image display system including the same.

2. Description of the Related Art

FIG. 1 is a view showing a concept of 3D eyeglasses.

As shown in FIG. 1, in 3D eyeglasses 1, liquid crystal shutters 2 and 3 are disposed in portions corresponding to right and left lenses of general eyeglasses, respectively.

Also, the liquid crystal (LC) shutters 2 and 3 are turned ON or OFF synchronously with image display by a shutter drive unit, thereby expressing a 3D stereoscopic image.

FIG. 2 is a circuit diagram showing a configuration of a general shutter drive unit.

A shutter drive unit 4 is integrated in the form of a driver IC (Integrated Circuit).

The shutter drive unit 4 includes a driver 5, a driver 6, a drive terminal T1 for the driver 5, and a drive terminal T2 for the driver 6. In this case, the driver 5 drives a capacitive load 2a of the liquid crystal shutter 2. Also, the driver 6 drives a capacitive load 3a of the liquid crystal shutter 3.

The driver 5 is composed of a p-channel MOS (PMOS) transistor PT1 and an n-channel MOS (NMOS) transistor NT1.

A source terminal of the PMOS transistor PT1 is connected to a power source Vdd and a drain terminal thereof is connected to the drive terminal T1.

A source terminal of the NMOS transistor NT1 is connected to a reference potential Vss and a drain terminal thereof is connected to the drive terminal T1.

The PMOS transistor PT1 is turned ON or OFF in accordance with an inverted signal /SWR1 (a mark "/" represents inversion) of a signal SWR1 supplied to a gate terminal of the PMOS transistor PT1.

The NMOS transistor NT1 is turned ON or OFF in accordance with a signal SWR2 supplied to a gate terminal of the NMOS transistor NT1.

The driver 6 is composed of a PMOS transistor PT2 and an n-channel MOS (NMOS) transistor NT2.

A source terminal of the PMOS transistor PT2 is connected to the power source Vdd, and a drain terminal thereof is connected to the drive terminal T2.

A source terminal of the NMOS transistor NT2 is connected to the reference potential Vss, and a drain terminal thereof is connected to the drive terminal T2.

The PMOS transistor PT2 is turned ON or OFF in accordance with an inverted signal /SWL1 of a signal SWL1 supplied to a gate thereof.

The NMOS transistor NT2 is turned ON or OFF in accordance with a signal SWL2 supplied to a gate terminal thereof.

With the shutter drive unit 4, the drivers 5 and 6 supply a voltage at the power source Vdd level, and a voltage at the reference potential Vss level to capacitive loads 2a and 3a as objects of drive of the liquid crystal shutters 2 and 3, thereby turning ON or OFF the liquid crystal shutters 2 and 3, respectively.

SUMMARY OF THE INVENTION

Now, the 3D eyeglasses are battery-driven from a viewpoint of manipulability or the like in some cases.

In the liquid crystal shutter drive unit for the 3D eyeglasses, the low power consumption drive is the essential item in order to enable a long-time continuous operation to be carried out with a small battery.

In the shutter drive unit described above, however, the liquid crystal shutters 2 and 3 are directly driven by the transistors connected to the power source Vdd or reference potential Vss, respectively. Therefore, the power consumption is large, and thus it is feared that it is difficult to reduce the power consumption and thus a sufficient operating time cannot be obtained with the small battery.

The present invention is made in order to solve the problems described above, and it is therefore desirable to provide a shutter drive unit in which it is possible to reduce power consumption, and even with a drive by a small battery, a sufficient operating time can be obtained for 3D eyeglasses, and a 3D image display system including the same.

In order to attain the desire described above, according to an embodiment of the present invention, there is provided a shutter drive unit including:

at least one inductor;
a first drive path connected to the at least one inductor;
a second drive path connected to the at least one inductor;
a first shutter including a first drive object capacitive load;
a second shutter including a second drive object capacitive load;
a first clamping circuit adapted to clamp the first drive object capacitive load either to a power source potential or to a reference potential through the first drive path;
a second clamping circuit adapted to clamp the second drive object capacitive load either to the power source potential or to the reference potential through the second drive path;
a first switch adapted to switch connection and non-connection between the at least one inductor and the first drive object capacitive load over to each other, the first switch being disposed in the first drive path between a position, in the first clamping circuit, for potential connection to the first drive path, and the at least one inductor;
a second switch adapted to switch connection and non-connection between the at least one inductor and the second drive object capacitive load over to each other, the second switch being disposed in the second drive path between a position, in the second clamping circuit, for potential connection to the second drive path, and the at least one inductor; and
a power collecting portion having a function of applying an intermediate voltage between the power source potential and the reference potential to the at least one inductor, and a power collecting function of collecting a power by the at least one inductor.

According to another embodiment of the present invention, there is provided a 3D image display system including:

an image display apparatus including a display device; and
3D eyeglasses including a shutter drive unit for driving a first shutter and a second shutter, the 3D eyeglasses visually recognizing the display device, thereby obtaining a 3D stereoscopic image;
the image display apparatus including a communication portion adapted to transmit a synchronous signal for an image to the 3D eyeglasses;
the 3D eyeglasses including
a communication portion adapted to receive the synchronous signal transmitted thereto from the communication portion of the image display apparatus, and
a control portion for controlling drive for the shutter drive unit at a timing synchronous with the synchronous signal received; and the shutter drive unit including at least one inductor, a first drive path connected to the at least one inductor, a second drive path connected to the at least one inductor, a first shutter including a first drive object capacitive load, a second shutter including a second drive object capacitive load, a first clamping circuit adapted to clamp the first drive object capacitive load either to a power source potential or to a reference potential through the first drive path, a second clamping circuit adapted to clamp the second drive object capacitive load either to the power source potential or to the reference potential through the second drive path, a first switch adapted to switch connection and non-connection between the at least one inductor and the first drive object capacitive load over to each other, the first switch being disposed in the first drive path between a position, in the first clamping circuit, for potential connection to the first drive path, and the at least one inductor, a second switch adapted to switch connection and non-connection between the at least one inductor and the second drive object capacitive load over to each other, the second switch being disposed in the second drive path between a position, in the second clamping circuit, for potential connection to the second drive path, and the at least one inductor, and a power collecting portion having a function of applying an intermediate voltage between the power source potential and the reference potential to the at least one inductor, and a power collecting function of collecting a power by the at least one inductor.

As set forth hereinabove, according to the embodiments of the present invention, it is possible to reduce the power consumption, and thus with the drive by the small battery, the sufficient operating time can be obtained for the 3D eyeglasses.

BRIEF DESCRIPTION OF THE DRAWINGS

FIG. 2 is a circuit diagram showing a configuration of a general shutter drive unit;

DETAILED DESCRIPTION OF THE PREFERRED EMBODIMENTS

The preferred embodiments of the present invention will be described in detail hereinafter with reference to the accompanying drawings.

It is noted that the description will be given below in accordance with the following order.

1. First Embodiment (3D image display system)
2. Second Embodiment (first configuration of shutter drive unit)
3. Third Embodiment (second configuration of shutter drive unit)
4. Fourth Embodiment (third configuration of shutter drive unit)

1. First Embodiment

Figure 1:
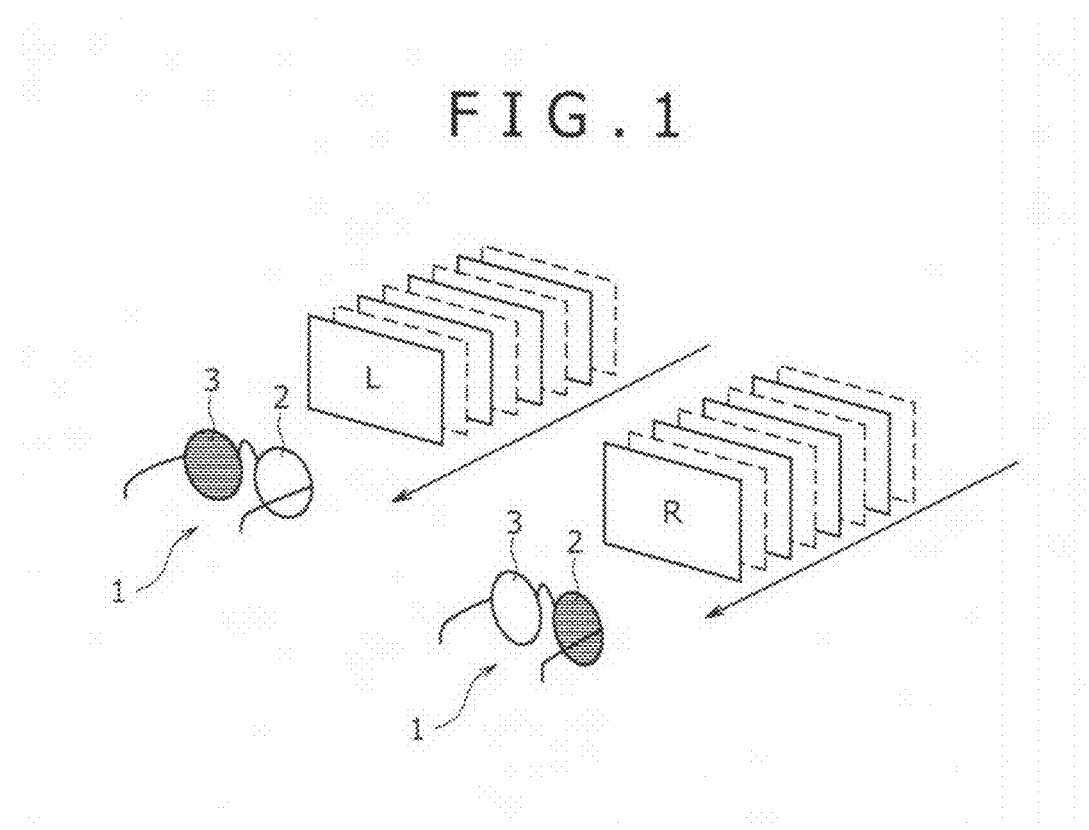
FIG. 1 is a view showing a concept of 3D eyeglasses.
Figure 3:
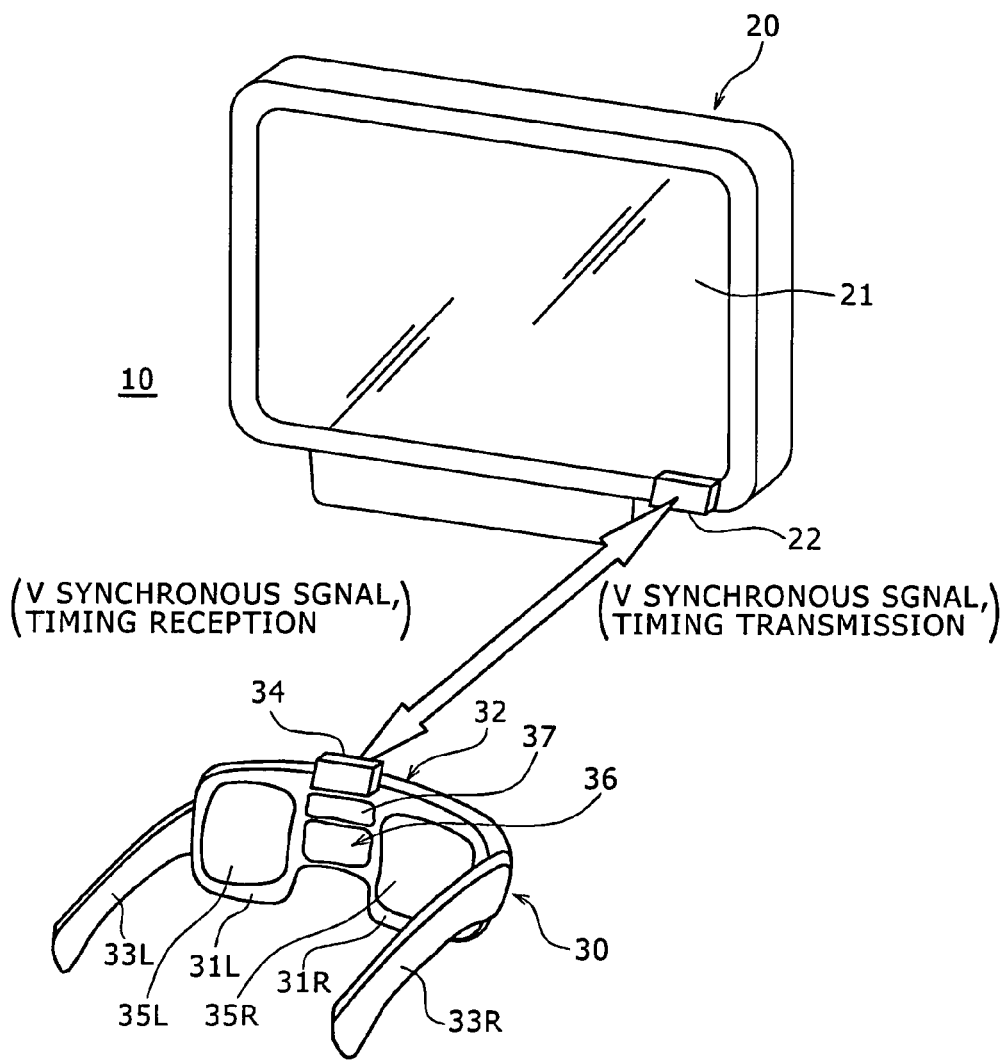
FIG. 3 is a view showing an outline of an exterior appearance of a 3D image display system according to a first embodiment of the present invention.

FIG. 3 is a view showing an outline of an exterior appearance of a three-dimensional image display system according to a first embodiment of the present invention.

Figure 4:
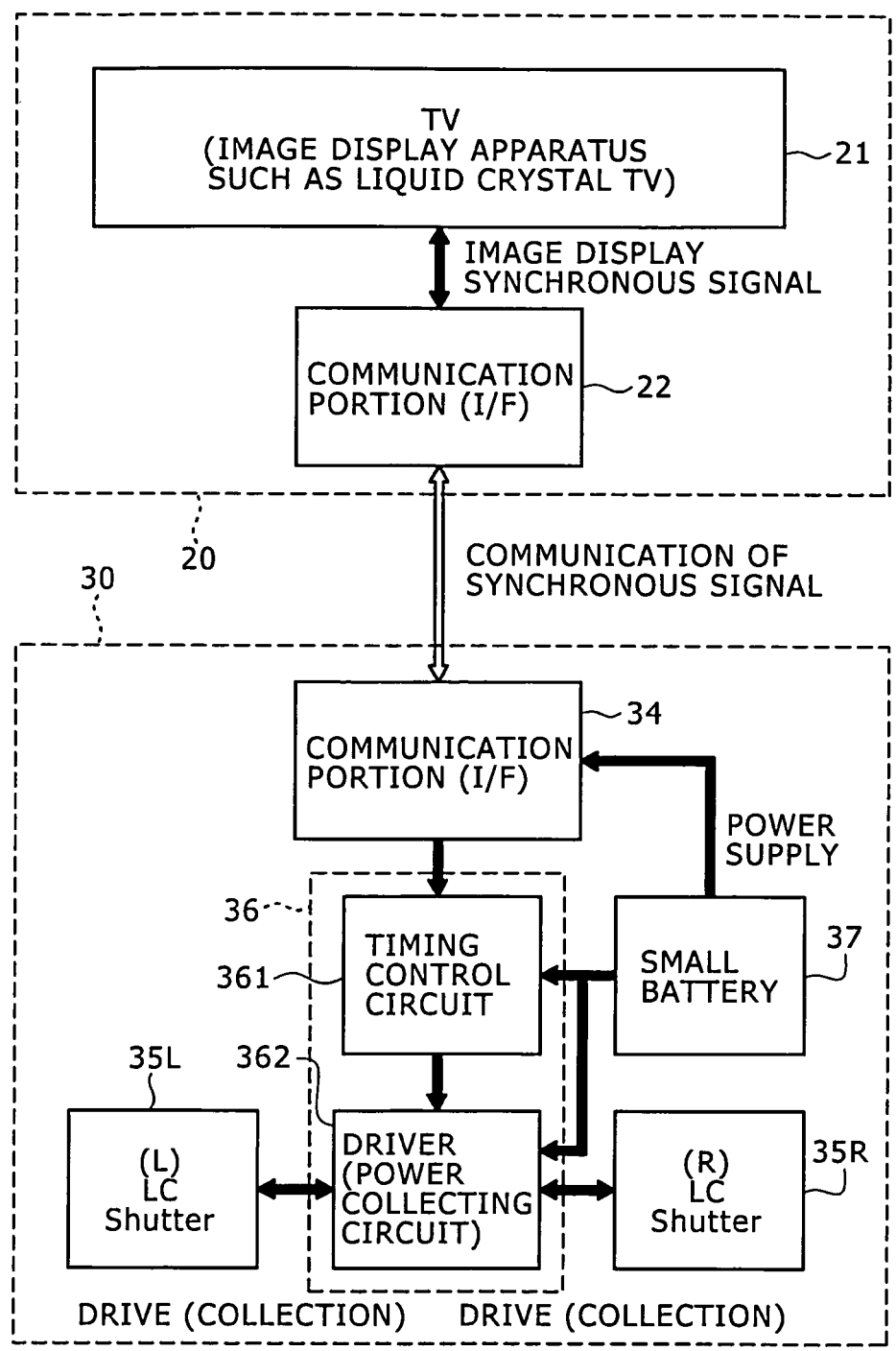
FIG. 4 is a block diagram showing a configuration of the 3D image display system according to the first embodiment of the present invention.

FIG. 4 is a block diagram showing a configuration of the three-dimensional image display system according to the first embodiment of the present invention.

This three-dimensional (3D) image display system 10 is composed of an image display apparatus 20 and a 3D eyeglass main body 30.

The image display apparatus 20 includes a display device 21 and a communication portion 22.

The display device 21, for example, is composed of a liquid crystal television (TV) apparatus and the like, and displays thereon an image which is stereoscopically viewed so as to follow the drive for the 3D eyeglass main body 30.

The communication portion 22 has a function of transmitting a synchronous signal or the like for image display, and receiving information from the 3D eyeglass main body 30 in order that the 3D eyeglass main body 30 may carry out shutter drive synchronously with a display operation of the display device 21.

A vertical synchronous signal VSYNC, for example, is contained in the synchronous signal for the image display which is transmitted from the communication portion 22 to the 3D eyeglass main body 30.

The communication portion 22 carries out a communication with the 3D eyeglass main body 30 in a wireless style. An infrared (IR) communication, for example, is used in this wireless communication.

The 3D eyeglass main body 30 has rims 31R and 31L, a bridge 32 formed between the rims 31R and 31L, and temples 33R and 33L similarly to the case of the normal eyeglasses.

Also, the 3D eyeglass main body 30 includes a communication portion 34, liquid crystal (LC) shutters 35R and 35L, a shutter drive unit (driver IC) 36, and a small battery 37.

The LC shutter 35R forms a first shutter, and the LC shutter 35L forms a second shutter.

The LC shutter 35R is fixed to the rim 31R, and the LC shutter 35L is fixed to the rim 31L.

The communication portion 34, the shutter drive unit 36, and the small battery 37 are disposed on an inner surface side (face side) of the bridge 32.

The communication portion 34 has a function of receiving the vertical synchronous signal VSYNC or the like for the image display. In this case, the communication portion 22 of the image display apparatus 20 transmits the vertical synchronous signal VSYNC or the like for the image display to the 3D eyeglass main body 30. Also, the 3D eyeglass main body 30 carries out the shutter driving operation synchronously with the display operation of the display device 21 in accordance with the vertical synchronous signal VSYNC or the like.

The communication portion 34 supplies the vertical synchronous signal VSYNC thus received to the shutter drive unit 36.

The shutter drive unit 36 controls drive timings for the LC shutters 35R and 35L synchronously with the vertical synchronous signal VSYNC received by the communication portion 34, and drives the LC shutters 35R and 35L in accordance with the drive timings.

The shutter drive unit 36 is composed of a timing control circuit 361 and a driver 362 which are configured in the form of an IC. In this case, the timing control circuit 361 controls the drive timings for the LC shutters 35R and 35L. Also, the driver 362 drives the LC shutters 35R and 35L in accordance with the control made by the timing control circuit 361.

The driver IC of the shutter drive unit 36 has a function of applying a potential at a power source potential Vdd level and a potential at a reference potential Vss level, for example, a GND level to each of the LC shutters 35R and 35L, thereby controlling ON/OFF of each of the LC shutters 35R and 35L, respectively.

The shutter drive unit 36 alternately opens and closes the right and left LC shutters 35R and 35L so as to correspond to the image display in the manner described above, thereby obtaining a stereoscopic image.

In the shutter drive unit 36, a clamping circuit for clamping to the power source (power collection capacitance) for power collection, the power source potential Vdd, and the reference potential Vss, for example, the GND potential is used for output to drive object capacitive loads of the LC shutters 35R and 35L.

Also, the shutter drive unit 36 has a power collecting function based on an LC resonance with the drive object capacitive load using at least one inductor L for the purpose of reducing the power consumption.

In the shutter drive unit 36 of any of the second to fourth embodiments, the large reduction of the power consumption is realized based on the power collecting function. Also, in the shutter drive unit 36, the number of terminals is reduced, and an impedance of a power collection path is reduced, thereby realizing the enhancement of a power collection efficiency.

Hereinafter, three concrete configurations of the shutter drive unit 36 will be described as a second embodiment, a third embodiment and a fourth embodiment of the present invention, respectively.

It is noted that in the following description, the shutter drive unit 36 is designated with reference to reference numeral 100.

2. Second Embodiment

Figure 5:
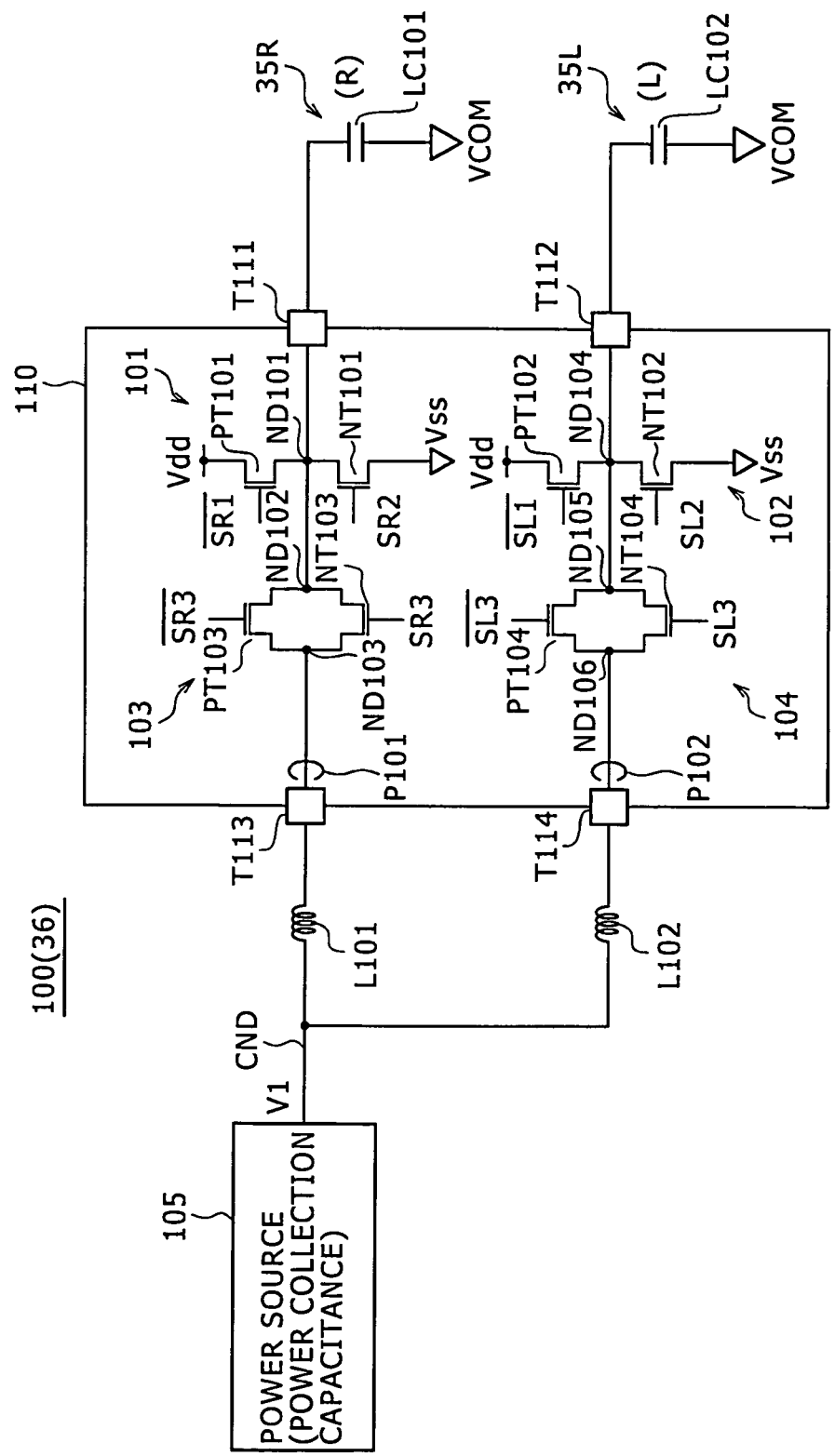
FIG. 5 is a circuit diagram showing a configuration of a shutter drive unit according to a second embodiment of the present invention.

FIG. 5 is a circuit diagram showing a configuration of a shutter drive unit according to a second embodiment of the present invention.

The shutter drive unit 100 shown in FIG. 5 has a first inductor L101, a second inductor L102, a first drive path P101 connected to one end of the first inductor L101, and a second drive path P102 connected to one end of the second inductor L102.

The shutter drive unit 100 has a first drive object capacitive load LC101 included in the LC shutter 35R as the first shutter, and a second drive object capacitive load LC102 included in the LC shutter 35L as the second shutter.

The shutter drive unit 100 has a first clamping circuit 101, a second clamping circuit 102, a first switch 103, and a second switch 104.

The shutter drive unit 100 has a power source 105 as a power collection capacitance portion in which the other end sides of the first inductor L101 and the second inductor L102 are commonly connected to each other.

Since in the second embodiment of the present invention, the power needs to be collected at a high efficiency, the inductor is connected every drive object capacitive load for connection, and the powers are collected from the respective drive object capacitive loads.

A connection node ND101, a connection node ND102, and a connection node ND103 are formed in the first drive path P101 in the order from a connection end side to the first drive object capacitive load LC101.

A connection node ND104, a connection node ND105, and a connection node ND106 are formed in the second drive path P102 in the order from a connection end side to the second drive object capacitive load LC102.

In the shutter drive unit 100, a part of the first drive path P101, a part of the second drive path P102, the first clamping circuit 101, the second clamping circuit 102, the first switch 103, and the second switch 104 are configured in the form of an IC, and are formed as a driver IC 110.

The driver IC 110 has connection terminals T111, T112, T113, and T114.

One end of the first drive path P101 including the connection nodes ND101 and ND102, and one end of the first drive object capacitive load LC101 of the LC shutter 35R are connected to the connection terminal T111. The other end of the first drive object capacitive load LC101 is connected to a supply line for a common voltage VCOM.

One end of the second drive path P102 including the connection nodes ND104 and ND105, and one end of the second drive object capacitive load LC102 of the LC shutter 35L are connected to the connection terminal T112. The other end of the second drive object capacitive load LC102 is connected to a supply line for the common voltage VCOM.

The other end of the first drive path P101 including the connection node ND103, and one end side of the inductor L101 are each connected to the connection terminal T113.

The other end of the second drive path P102 including the connection node ND106, and one end side of the inductor L102 are each connected to the connection terminal T114.

It is noted that in the second embodiment of the present invention, the common voltage VCOM is fixed, and, for example, is set as the reference potential (for example, as the GND level).

It is noted that the inversion drive of the common voltage VCOM is also possible.

The first clamping circuit 101 is connected to the connection node ND101, and is controlled in such a way that the first drive object capacitive load LC101 can be clamped either to the power source potential Vdd or to the reference potential Vss level through the first drive path P101.

The first clamping circuit 101 is composed of a PMOS transistor PT101 and an NMOS transistor NT101 each serving as a switch.

A source terminal of the PMOS transistor PT101 is connected to the power source Vdd, and a drain terminal thereof is connected to the connection node ND101 of the first drive path P101.

A source terminal of the NMOS transistor NT101 is connected to the reference potential Vss, and a drain terminal thereof is connected to the connection node ND101 of the first drive path P101.

The PMOS transistor PT101 is turned ON or OFF in accordance with an inversed signal /SR1 (a mark "/" represents inversion) of a signal SR1 supplied to a gate terminal thereof.

The NMOS transistor NT101 is turned ON or OFF in accordance with a signal SR2 supplied to a gate terminal thereof.

The second clamping circuit 102 is connected to the connection node ND104, and is controlled in such a way that the second drive object capacitive load LC102 can be clamped either to the power source potential Vdd or to the reference potential Vss level through the second drive path P102.

The second clamping circuit 102 is composed of a PMOS transistor PT102 and an NMOS transistor NT102 each serving as a switch.

A source terminal of the PMOS transistor PT102 is connected to the power source Vdd, and a drain terminal thereof is connected to the connection node ND104 of the second drive path P102.

A source terminal of the NMOS transistor NT102 is connected to the reference potential Vss, and a drain terminal thereof is connected to the connection node ND104 of the second drive path P102.

The PMOS transistor PT102 is turned ON or OFF in accordance with an inverted signal /SL1 (the mark "/" represents the inversion) of a signal SL1 supplied to the gate thereof.

The NMOS transistor NT102 is turned ON or OFF in accordance with a signal SL2 supplied to the gate thereof.

The first switch 103 is disposed in the first drive path P101 extending between a position, in the first clamping circuit 101, for the potential connection to the first drive path P101, and the one end of the inductor L101.

That is to say, the first, switch 103 is connected between the node ND102 and the node ND103 of the first drive path P101. Thus, the ON/OFF of the first switch 103 is controlled in such a way that connection and non-connection between the first inductor L101 and the first drive object capacitive load LC101 can be switched over to each other.

The first switch 103 is configured in the form of a transmission gate in which the drain terminal of the PMOS transistor PT103 and the source terminal of the NMOS transistor NT103 are connected to each other, and the source terminal of the PMOS transistor PT103 and the drain terminal of the NMOS transistor NT103 are connected to each other.

That is to say, the drain terminal of the PMOS transistor PT103 and the source terminal of the NMOS transistor NT103 are both connected to the connection node ND102, and the source terminal of the PMOS transistor PT103 and the drain terminal of the NMOS transistor NT103 are both connected to the connection node ND103.

Also, the gate terminal of the PMOS transistor PT103 is connected to a supply line for an inverted signal /SR3 of a signal SR3, and the gate terminal of the NMOS transistor NT103 is connected to a supply line for the signal SR3.

The second switch 104 is disposed in the second drive path P102 extending between a position, in the second clamping circuit 102, for potential connection to the second drive path P102, and one terminal of the inductor L102.

That is to say, the second switch 104 is connected between the node ND105 and the node ND106 of the second drive path P102. Thus, ON/OFF of the second switch 104 is controlled in such a way that connection and non-connection between the inductor L102 and the second drive object capacitive load LC102 can be switched over to each other.

The second switch 104 is configured in the form of a transmission gate in which the drain terminal of the PMOS transistor PT104 and the source terminal of the NMOS transistor NT104 are connected to each other, and the source terminal of the PMOS transistor PT104 and the drain terminal of the NMOS transistor NT104 are connected to each other.

That is to say, the drain terminal of the PMOS transistor PT104 and the source terminal of the NMOS transistor NT104 are connected to the connection node ND105, and the source terminal of the PMOS transistor PT104 and the drain terminal of the NMOS transistor NT104 are connected to the connection node ND106.

Also, the gate terminal of the PMOS transistor PT104 is connected to a supply line for an inverted signal /SL3 of a signal SL3, and the gate terminal of the NMOS transistor NT104 is connected to a supply line for the signal SL3.

The other end sides of the first inductor L101 and the second inductor L102 are both connected to the power source 105 as a power collection capacitance portion through a connection node CND. Thus, the power source 105 includes a function of applying an intermediate voltage between the power source potential Vdd and the reference potential Vss to the connection node CND, and a power collecting function of collecting the power.

For the power source 105, the intermediate voltage V1 which is applied to the connection node CND, for example, is set as a half value of (Vdd+Vss)/2 between the power source potential Vdd and the reference potential Vss in consideration of a power collection efficiency.

However, the intermediate voltage V1 can be set as any value between the power source potential Vdd and the reference potential Vss except for both the power source potential Vdd and the reference potential Vss. Although the power collection efficiency in this case is inferior to that in the case of the half value, the power collection can be realized and the reduction of the power consumption can be realized.

With the shutter drive unit 100 having such a configuration, the timing control circuit 361 carries out the application for the intermediate voltage V1, and the level control for the signals /SR1, SR2, /SR3, SR3, /SL1, SL2, /SL3, and SL3.

The timing control circuit 361 carries out the control in such a way that the operations for clamping the first drive object capacitive load LC101 of the first LC shutter 35R, and the second drive object capacitive load LC102 of the second LC shutter 35L to corresponding ones of the power source potential Vdd and the reference potential Vss are carried out in a complementary style.

That is to say, when the first drive object capacitive load LC101 is clamped to the power source potential Vdd, the timing control circuit 361 carries out the control in such a way that the second drive object capacitive load LC102 is clamped to the reference potential Vss.

On the other hand, when the first drive object capacitive load LC101 is clamped to the reference potential Vss, the timing control circuit 361 carries out the control in such a way that the second drive object capacitive load LC102 is clamped to the power source potential Vdd.

It is noted that the timing control circuit 361 carries out the control so as to obtain three values in states of the Vdd clamping, the Vss clamping, the high-impedance (Hi-Z).

The timing control circuit 361 controls both the first clamping circuit 101 and the second clamping circuit 102 in such a way that the complementary clamping operations are alternately carried out on one-by-one basis for one field period of time synchronously with the vertical synchronous signal VSYNC.

The timing control circuit 361 carries out the control so as to include a first phase PH1 in which the electric charges are supplied from the power source (power collection capacitance portion) 105 either to the first drive object capacitive load LC101 or to the second drive object capacitive load LC102.

The timing control circuit 361 carries out the control so as to include a second phase PH2 in which the electric charges either in the first drive object capacitive load LC101 or in the second drive object capacitive load LC102 are collected to the power source (power collection capacitance portion) 105.

The timing control circuit 361 controls the levels of the signals /SR3, SR3, /SL3, and SL3 in such a way that the first switch 103 and the second switch 104 are turned ON in each of the first phase PH1 and the second phase PH2.

Specifically, the timing control circuit 361 controls the levels of the signals /SR3, SR3, /SL3, and SL3 in such a way that the signals SR3 and SL3 each become a High level (Vdd level) in each of the first phase PH1 and the second phase PH2.

In the second embodiment of the present invention, the first clamping circuit 101 and the second clamping circuit 102 are controlled in such a way that as described above, the complementary clamping operations are alternately carried out on the one-by-one basis.

Therefore, in the second embodiment of the present invention, the functions of the first phase PH1 and the second phase PH2 for the first drive object capacitive load LC101 and the second drive object capacitive load LC102 overlap each other.

More specifically, when the function of the first phase PH1 is expressed for the first drive object capacitive load LC101, the function of the second phase PH2 is expressed for the second drive object capacitive load LC102 in parallel therewith.

On the other hand, when the function of the first phase PH1 is expressed for the second drive object capacitive load LC102, the function of the second phase PH2 is expressed for the first drive object capacitive load LC101 in parallel therewith.

The timing control circuit 361 controls the levels of the signals /SR3, SR3, /SL3, and SL3 in such a way that the first switch 103 and the second switch 104 are each held in an OFF state for a shutter ON/OFF period of time between the first phase PH1 and the second phase PH2.

Specifically, the timing control circuit 361 controls the levels of the signals /SR3, SR3, /SL3, and SL3 in such a way that the signals SR3 and SL3 each become a Low level (Vss level) for the shutter ON/OFF period of time between the first phase PH1 and the second phase PH2.

The timing control circuit 361 controls either the first clamping circuit 101 or the second clamping circuit 102 in such a way that the drive object capacitive load which is clamped to the reference potential Vss before entering the first phase PH1, and is held in the ON state for the period TOF of time is clamped to the power source potential Vdd.

The timing control circuit 361 controls either the second clamping circuit 102 or the first clamping circuit 101 in such a way that the drive object capacitive load which is clamped to the power source potential Vdd before entering the first phase PH1, and is held in the OFF state for the period TOF of time is clamped to the reference potential Vss.

When the first drive object capacitive load LC101 is clamped to the power source potential Vdd for the period TOF of time, the timing control circuit 361 carries out the control in such a way that the signal SR1 becomes the High level (the signal /SR1 becomes the Low level), and the signal SR2 becomes the Low level.

At this time, for the purpose of clamping the second drive object capacitive load LC102 to the reference potential Vss, the timing control circuit 361 carries out the control in such a way that the signal SL1 becomes the Low level (the signal /SL1 Becomes the High level) and the signal SL2 becomes the High level.

When the second drive object capacitive load LC102 is clamped to the power source potential Vdd for the period TOF of time, the timing control circuit 361 carries out the control in such a way that the signal SL1 becomes the High level (the signal /SL1 becomes the Low level), and the signal SL2 becomes the Low level.

At this time, for the purpose of clamping the first drive object capacitive load LC101 to the reference potential Vss, the timing control circuit 361 carries out the control in such a way that the signal SR1 becomes the Low level (the signal /SR1 becomes the High level), and the signal SR2 becomes the High level.

A period of time ranging from a time point of exceeding the intermediate voltage V1 from the reference potential Vss in the first phase PH1 to a time point of becoming lower than the intermediate voltage V1 in the second phase PH2 in accordance with the above control made by the timing control circuit 361 becomes an ON period of time of the LC shutter 35R or 35L.

Figure 6:
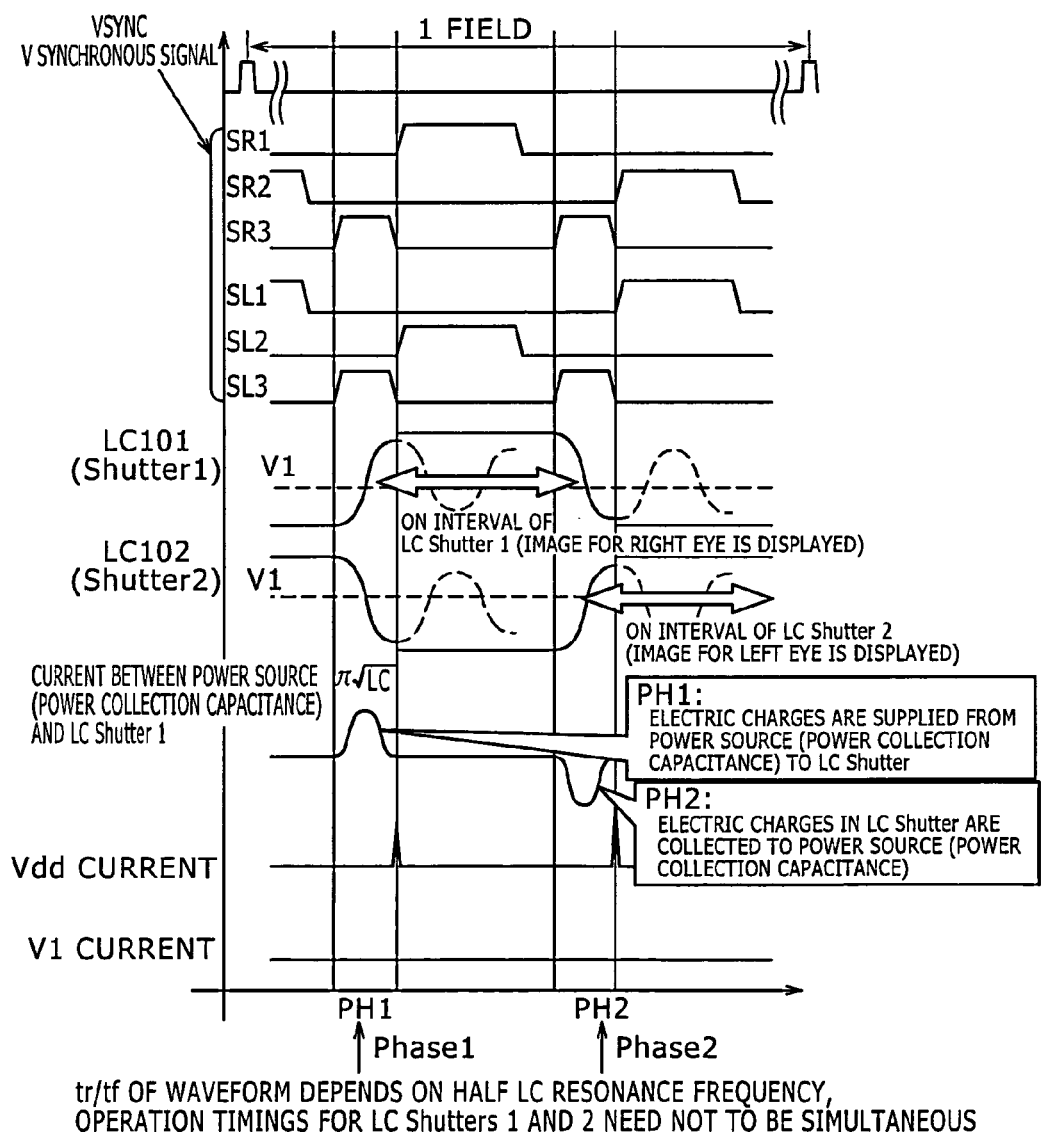
FIG. 6 is a timing chart explaining an operation of the shutter drive unit according to the second embodiment of the present invention.

FIG. 6 is a timing chart explaining an operation of the shutter drive unit according to the second embodiment of the present invention.

Figure 7:
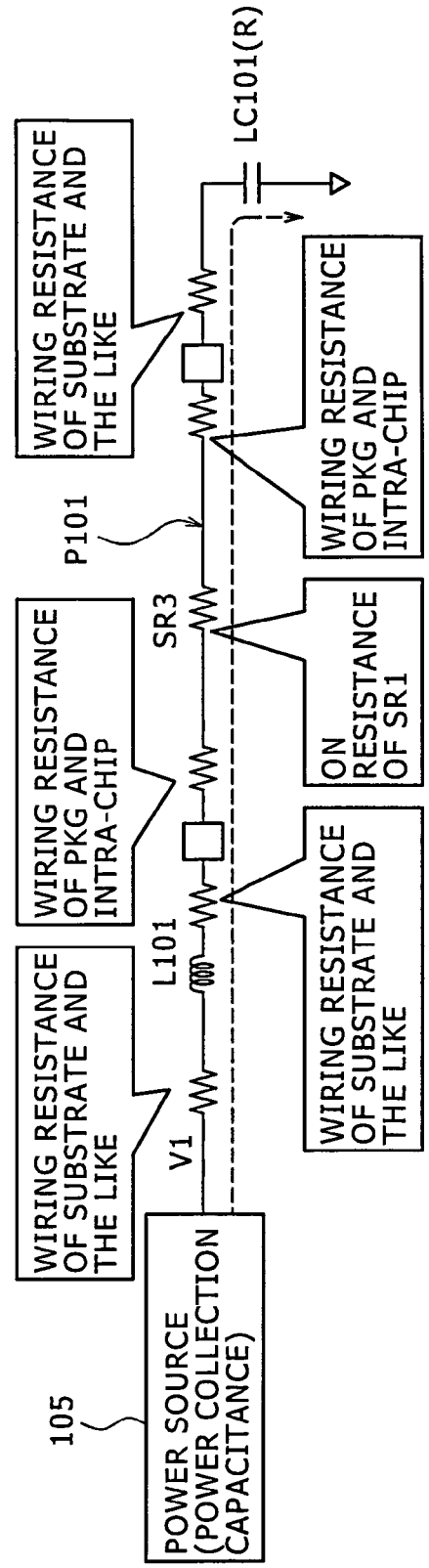
FIG. 7 is a circuit diagram, partly in block, showing an outline of an operation for a first shutter in a first phase of the shutter drive unit according to the second embodiment of the present invention.

FIG. 7 is a circuit diagram, partly in block, showing an outline of an operation of the shutter drive unit, according to the second embodiment of the present invention, carried out for the LC shutter 35R as the first shutter in the first phase PH1.

FIG. 6 shows the drive timing set in accordance with the control made by the timing control circuit 361 described above.

That is to say, FIG. 6 shows the timings for the control for the levels of the signals SR1 to SR3, and SL1 to SL3 in accordance with which the first clamping circuit 101, the second clamping circuit 102, the first switch 103, and the second switch 104 are controlled.

In addition, FIG. 6 shows operating voltages in the first drive object capacitive load LC101 of the LC shutter 35R, and the second drive object capacitive load LC102 of the LC shutter 35L.

Moreover, FIG. 6 shows an operating current between the power source (the power collection capacitance portion) 105 and the first drive object capacitive load LC101, a current from the power source Vdd, and a current from the power source (the power collection capacitance portion) 105 for application of the intermediate voltage V1 to the connection node CND.

Firstly, a description will be given with respect to an outline of an operation for the first drive object capacitive load LC101 of the LC shutter 35R during the interval of the first phase PH1.

The intermediate voltage V1 is applied from the power source 105 to each of the first inductor L101 and the second inductor L102.

Also, from a state in which the GND potential as the reference potential Vss is applied to the first drive object capacitive load LC101 of the first LC shutter 35R, the signal SR3 is switched over to the High level.

As a result, the first switch 103 is turned ON, the electric charges are moved from the power source (power collection capacitance portion) 105 to the first drive object capacitive load LC101 through the first inductor L101 and the first drive path P101, and the potential at the first drive object capacitive load LC101 rises.

At this time, the potential at the first drive object capacitive load LC101 exceeds the intermediate voltage V1 to rise close to the power source potential Vdd due to the LC resonance operation made by an inductance L of the first inductor L101, and a capacitance C of the first drive object capacitive load LC101.

The reason for this is because an electromotive force is generated in the first inductor L101 due to the current caused to flow in the voltage transition described above.

After the potential at the first drive object capacitive load LC101 rises close to the power source potential Vdd, the signal SR3 is switched over to the Low level. As a result, the first switch 103 is turned OFF.

Also, the signal SR1 and the signal SR2 are switched over to the High level and the Low level, respectively.

It is noted that the signal SR2 needs to be switched over to the Low level before the signal SR3 is switched over to the High level.

As a result, the PMOS transistor PT101 of the first clamping circuit 101 is turned ON, the NMOS transistor NT101 of the first clamping circuit 101 is turned OFF, and the potential at the first drive object capacitive load LC101 is clamped to the power source potential Vdd.

It is noted that the NMOS transistor NT101 needs to be turned OFF before the signal SR3 is switched over to the High level.

When the first drive object capacitive load LC101 is clamped to the power source potential Vdd, the current from the power source Vdd is caused to flow into the first drive object capacitive load LC101, and the current is also caused to flow from the power source (power collection capacitance portion) 105 into the first drive object capacitive load LC101 through the first inductor L101 and the first switch 103.

For this reason, as shown in FIG. 7, a power loss is caused due to a parasitic resistance parasitic in the substrate, the package (PKG), the intra-chip wiring and the like in addition to an ON resistance of the first switch 103.

The power loss can be reduced by reducing the parasitic resistance, and thus the power consumption can be further reduced.

An operation during the interval of the second phase PH2 is basically reversed to the operation during the interval of the first phase PH1.

During the interval of the second phase PH2, from a state in which the power source potential Vdd is applied to the first drive object capacitive load LC101 of the first LC shutter 35R, the signal SR3 is switched over to the High level.

As a result, the first switch 103 is turned ON, the electric charges are moved from the first drive object capacitive load LC101 to the power source (power collection capacitance portion) 105, and the potential at the first drive object capacitive load LC101 drops.

In this case as well, likewise, the potential at the first drive object capacitive load LC101 exceeds the intermediate voltage V1 to drop close to the GND level due to the LC resonance operation.

After the potential at the first drive object capacitive load LC101 drops close to the GND level, the signal SR3 is switched over to the Low level. As a result, the first switch 103 is turned OFF.

Also, the signal SR1 and the signal SR2 are switched over to the Low level and the High level, respectively.

It is noted that the signal SR1 needs to be switched over to the Low level before the signal SR3 is switched over to the High level.

As a result, the PMOS transistor PT101 of the first clamping circuit 101 is turned OFF, the NMOS transistor NT101 of the first clamping circuit 101 is turned ON, and the potential at the first drive object capacitive load LC101 is clamped to the GND potential as the reference potential Vss.

It is noted that the PMOS transistor PT101 needs to be turned OFF before the signal SR3 is switched over to the High level.

On the other hand, an operation for the second drive object capacitive load LC102 of the second LC shutter 35L during the interval of the first phase PH1 becomes the same as that for the first drive object capacitive load LC101 of the first LC shutter 35R during the interval of the second phase PH2.

The intermediate voltage V1 is applied from the power source 105 to each of the first inductor L101 and the second inductor L102.

Also, from a state in which the power source potential Vdd is applied to the second drive object capacitive load LC102 of the second LC shutter 35L, the signal SL3 is switched over to the High level.

As a result, the second switch 104 is turned ON, the electric charges are moved from the second drive object capacitive load LC102 to the power source (power collection capacitance portion) 105, and the potential at the second drive object capacitive load LC102 drops.

In this case as well, likewise, the potential at the second drive object capacitive load LC102 exceeds the intermediate voltage V1 to drop close to the GND level due to the LC resonance operation.

After the potential at the second drive object capacitive load LC102 drops close to the GND level, the signal SL3 is switched over to the Low level. As a result, the second switch 104 is turned OFF.

Also, the signal SL1 and the signal SL2 are switched over to the Low level and the High level, respectively.

It is noted that the signal SL1 needs to be switched over to the Low level before the signal SL3 is switched over to the High level.

As a result, the PMOS transistor PT102 of the second clamping circuit 102 is turned OFF, the NMOS transistor NT102 of the second clamping circuit 102 is turned ON, and the potential at the second drive object capacitive load LC102 is clamped to the GND potential as the reference potential Vss.

It is noted that the PMOS transistor PT102 needs to be turned OFF before the signal SL3 is switched over to the High level.

On the other hand, an operation for the second drive object capacitive load LC102 of the second LC shutter 35L during the interval of the second phase PH2 becomes the same as that for the first drive object capacitive load LC101 of the first LC shutter 35R during the interval of the first phase PH1.

That is to say, from a state in which the GND potential as the reference potential Vss is applied to the second drive object capacitive load LC102 of the second LC shutter 35L, the signal SL3 is switched over to the High level.

As a result, the second switch 104 is turned ON, the electric charges are moved from the power source (power collection capacitance portion) 105 to the second drive object capacitive load LC102 through the second inductor L102 and the second drive path P102, and the potential at the second drive object capacitive load LC102 rises.

At this time, the potential at the second drive object capacitive load LC102 exceeds the intermediate voltage V1 to rise close to the power source potential Vdd due to an LC resonance operation made by an inductance L of the second inductor L102, and a capacitance C of the second drive object capacitive load LC102.

The reason for this is because an electromotive force is generated in the second inductor L102 due to the current caused to flow in the voltage transition described above.

After the potential at the second drive object capacitive load LC102 rises close to the power source potential Vdd, the signal SL3 is switched over to the Low level. As a result, the second switch 104 is turned OFF.

Also, the signal SL1 and the signal SL2 are switched over to the High level and the Low level, respectively.

It is noted that the signal SL2 needs to be switched over to the Low level before the signal SL3 is switched over to the High level.

As a result, the PMOS transistor PT102 of the second clamping circuit 102 is turned ON, the NMOS transistor NT102 of the second clamping circuit 102 is turned OFF, and the potential at the second drive object capacitive load LC102 is clamped to the power source potential Vdd.

It is noted that the NMOS transistor NT102 needs to be turned OFF before the signal SL3 is switched over to the High level.

When the second drive object capacitive load LC102 is clamped to the power source potential Vdd, the current from the power source Vdd is caused to flow into the second drive object capacitive load LC102, and the current is also caused to flow from the power source (power collection capacitance portion) 105 into the second drive object capacitive load LC102 through the second inductor L102 and the second switch 104.

For this reason, the power loss is caused due to the parasitic resistance in the substrate, the package (PKG), the intra-chip wiring and the like in addition to the ON resistance of the second switch 104.

The power loss can be reduced by reducing the parasitic resistance, and thus the power consumption can be further reduced.

Next, the operation proceeds to an operation during the interval of the second phase PH2.

During the interval of the second phase PH2, from a state in which the power source potential Vdd is applied to the second drive object capacitive load LC102 of the second LC shutter 35L, the signal SL3 is switched over to the High level.

As a result, the second switch 104 is turned ON, the electric charges are moved from the second drive object capacitive load LC102 to the power source (power collection capacitance portion) 105, and the potential at the second drive object capacitive load LC102 drops.

In this case as well, likewise, the potential at the second drive object capacitive load LC102 exceeds the intermediate voltage V1 to drop close to the GND level due to the LC resonance operation.

After the potential at the second drive object capacitive load LC102 drops close to the GND level, the signal SL3 is switched over to the Low level. As a result, the second switch 104 is turned OFF.

Also, the signal SL1 and the signal SL2 are switched over to the Low level and the High level, respectively.

As a result, the PMOS transistor PT102 of the clamping circuit 102 is turned OFF, the NMOS transistor NT102 of the clamping circuit 102 is turned ON, and the potential at the second drive object capacitive load LC102 is clamped to the GND potential as the reference potential Vss.

The operation for the first drive object capacitive load LC101 for the period of time of the first phase PH1 is carried out in parallel with the operation for the second drive object capacitive load LC102 of the second LC shutter 35L during the interval of the second phase PH2.

The second embodiment of the present invention adopts a form such that the inductors are each directly connected to the power source (power collection capacitance portion 105) for collecting the power.

Since the first and second inductors L101 and L102, and the power source (power collection capacitance portion) 105 are connected to each other on the outside (on the substrate) of the driver IC 110, it is possible to reduce any of extra paths.

The switching timings for the switching elements of the clamping circuits, and the switches 103 and 104, and the application of the voltages to the capacitive loads are by no means limited to the above case.

However, a rectifying diode is omitted here.

For this reason, the first and second switches 103 and 104 through which the drive object capacitive loads are connected to the power source (power collection capacitance), and the switching elements of the first and second clamping circuits 101 and 102 for the clamping to the final potentials (the power source, and GND) are not turned ON at the same time.

3. Third Embodiment

Figure 8:
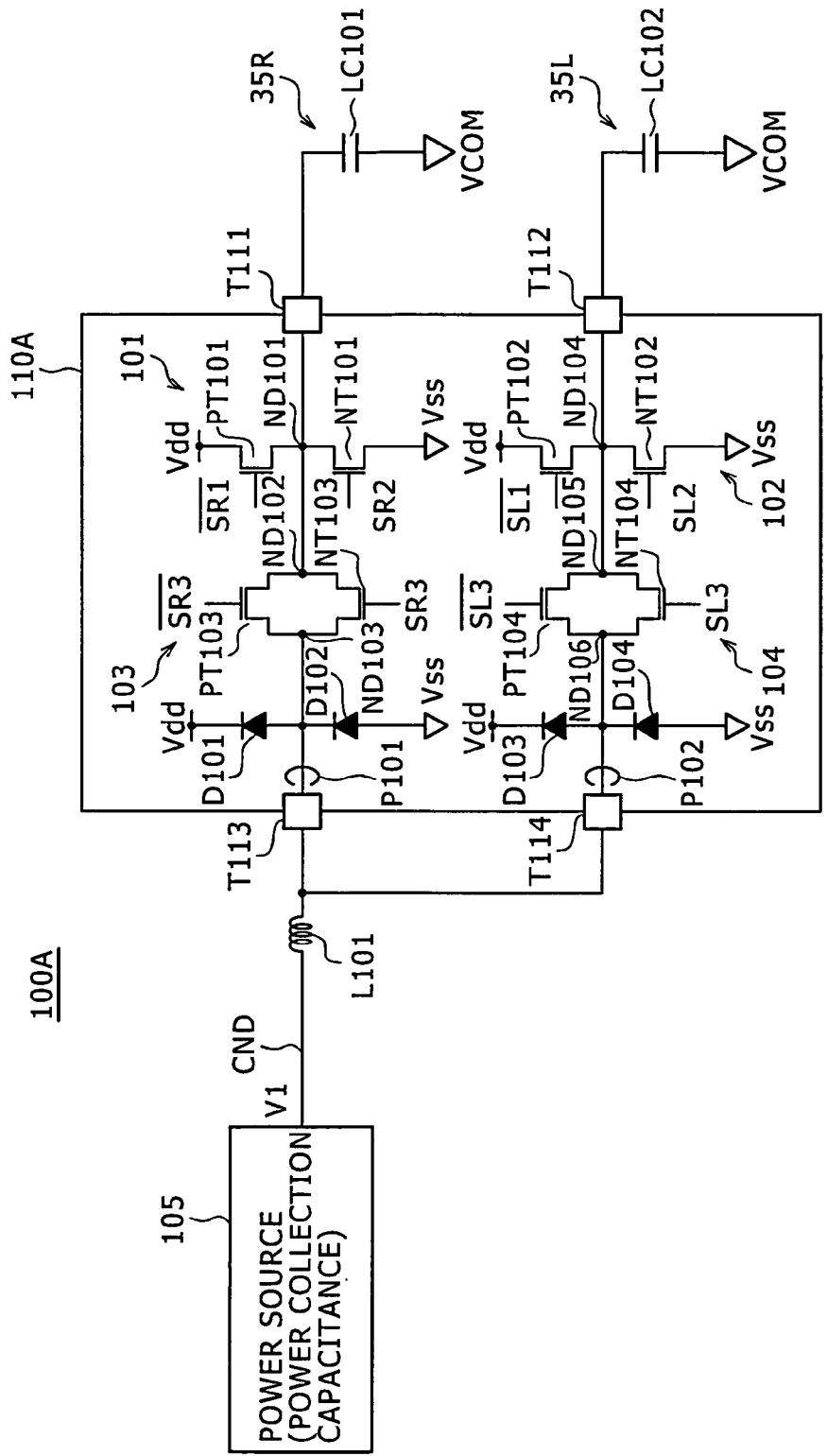
FIG. 8 is a circuit diagram showing a configuration of a shutter drive unit according to a third embodiment of the present invention.

FIG. 8 is a circuit diagram showing a configuration of a shutter drive unit according to a third embodiment of the present invention.

Figure 9:
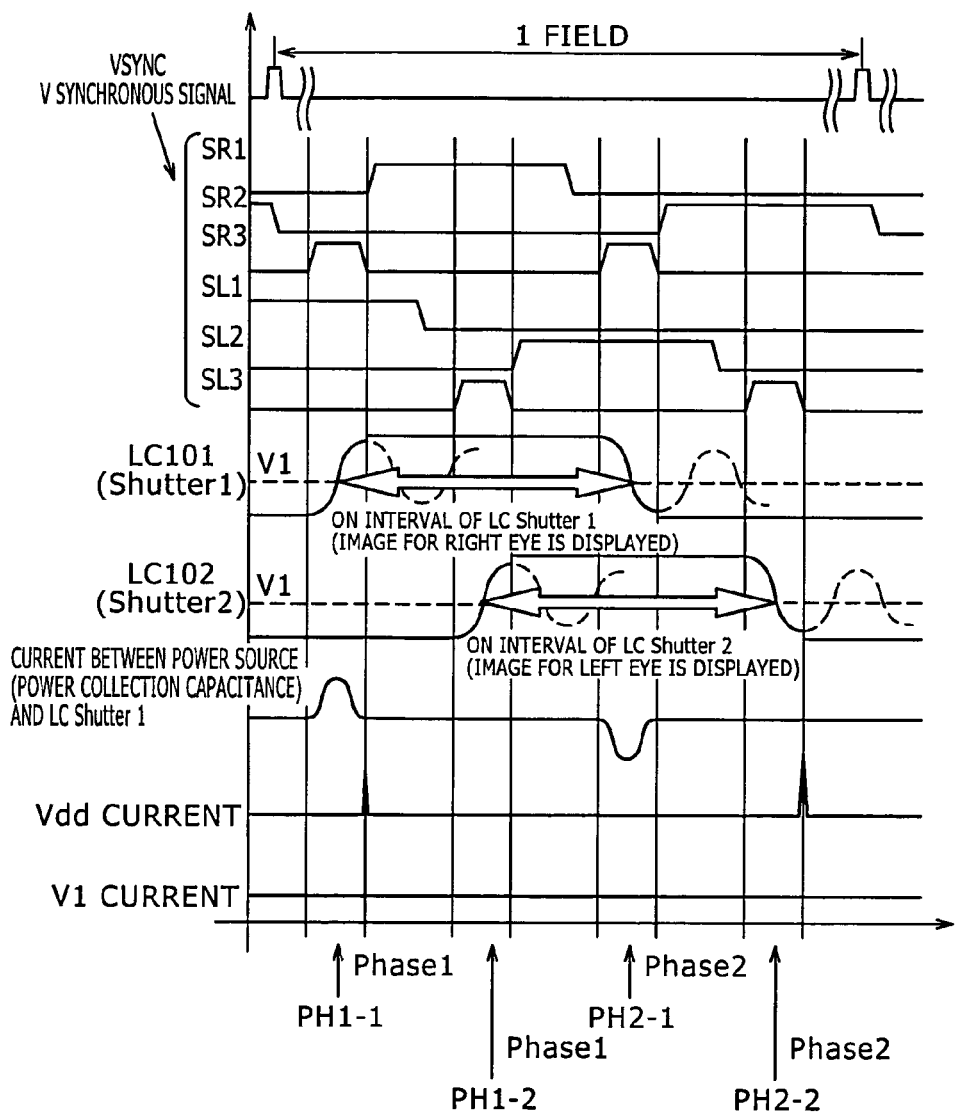
FIG. 9 is a timing chart explaining an operation of the shutter drive unit according to the third embodiment of the present invention.

FIG. 9 is a timing chart explaining an operation of the shutter drive unit according to the third embodiment of the present invention.

The shutter drive unit 100A according to the third embodiment of the present invention is different from the shutter drive unit 100 according to the second embodiment of the present invention in that the inductor is shared between the drive object capacitive loads.

Referring to FIG. 8, the first drive path P101 and the second drive path P102 are each connected to one end side of the inductor L101.

In addition, in the shutter drive unit 100A of the third embodiment, diodes each serving as an ESD (Electrostatic Discharge) protecting element are connected between each of the first drive path P101 and the second drive path P102, and the power source potential Vdd, and between each of the first drive path P101 and the second drive path P102, and the reference potential Vss, respectively.

Diodes D101 and D102 are each connected to the first drive path P101.

An anode terminal of the diode D101 is connected to the first drive path P101, and a cathode terminal thereof is connected to the power source potential Vdd.

A cathode terminal of the diode D102 is connected to the first drive path P101, and an anode terminal thereof is connected to the reference potential Vss.

Diodes D103 and D104 are each connected to the second drive path P102.

An anode terminal of the diode D103 is connected to the second drive path P102, and a cathode thereof is connected to the power source potential Vdd.

A cathode terminal of the diode D104 is connected to the second drive path P102, and an anode terminal thereof is connected to the reference potential Vss.

Although in the shutter drive unit 100A of the third embodiment, the inductor L101 is shared between the first and second drive object capacitive loads LC101 and LC102, the following points can be given as problems when the inductor L101 is shared.

It is thought that since the charge sharing operation is carried out between the capacitive loads in the operation in which the timing exists at which two loads are driven at the same time, the efficiency of collecting the power is reduced.

When although the power collection efficiency is feared to be reduced, if the reduction of the power collection efficiency falls within the allowable range, the power collection efficiency can be used as it is. On the other hand, when the power collection efficiency needs to be improved, as shown in FIG. 9, the drive timings for the two capacitive loads are shifted from each other, thereby making it possible to carry out the efficiently the power collection.

The timing control circuit 361 carries out the control in such a way that the operations for clamping the first drive object capacitive load LC101 of the first LC shutter 35R, and the second drive object capacitive load LC102 of the second LC shutter 35L to corresponding ones of the power source potential Vdd and the reference potential Vss are not carried out in the complementary style, but are carried out individually.

Also, when as shown in FIG. 9, the drive timings for the first drive object capacitive load LC101 of the first LC shutter 35R, and the second drive object capacitive load LC102 of the second LC shutter 35L are shifted from each other, the inductor can be shared between the drive object capacitive loads.

In the third embodiment of the present invention, the timing control circuit 361 individually controls the first clamping circuit 101 and the second clamping circuit 102 for one field period of time synchronously with the vertical synchronous signal VSYNC.

The timing control circuit 361 carries out the control so as to include a first phase PH1-1 in which the electric charges are supplied from the power source (power collection capacitance portion) 105 to the first drive object capacitive load LC101.

The timing control circuit 361 carries out the control so as to include a second phase PH2-1 in which the electric charges in the first drive object capacitive load LC101 are collected to the power source (power collection capacitance portion) 105.

The timing control circuit 361 carries out the control so as to include a first phase PH1-2 in which the electric charges are supplied from the power source (power collection capacitance portion) 105 to the second drive object capacitive load LC102.

The timing control circuit 361 carries out the control so as to include a second phase PH2-2 in which the electric charges in the second drive object capacitive load LC102 are collected to the power source (power collection capacitance portion) 105.

Since other basic operations are the same as those in the case of the second embodiment, a detailed description thereof is omitted here for the sake of simplicity.

4. Fourth Embodiment

Figure 10:
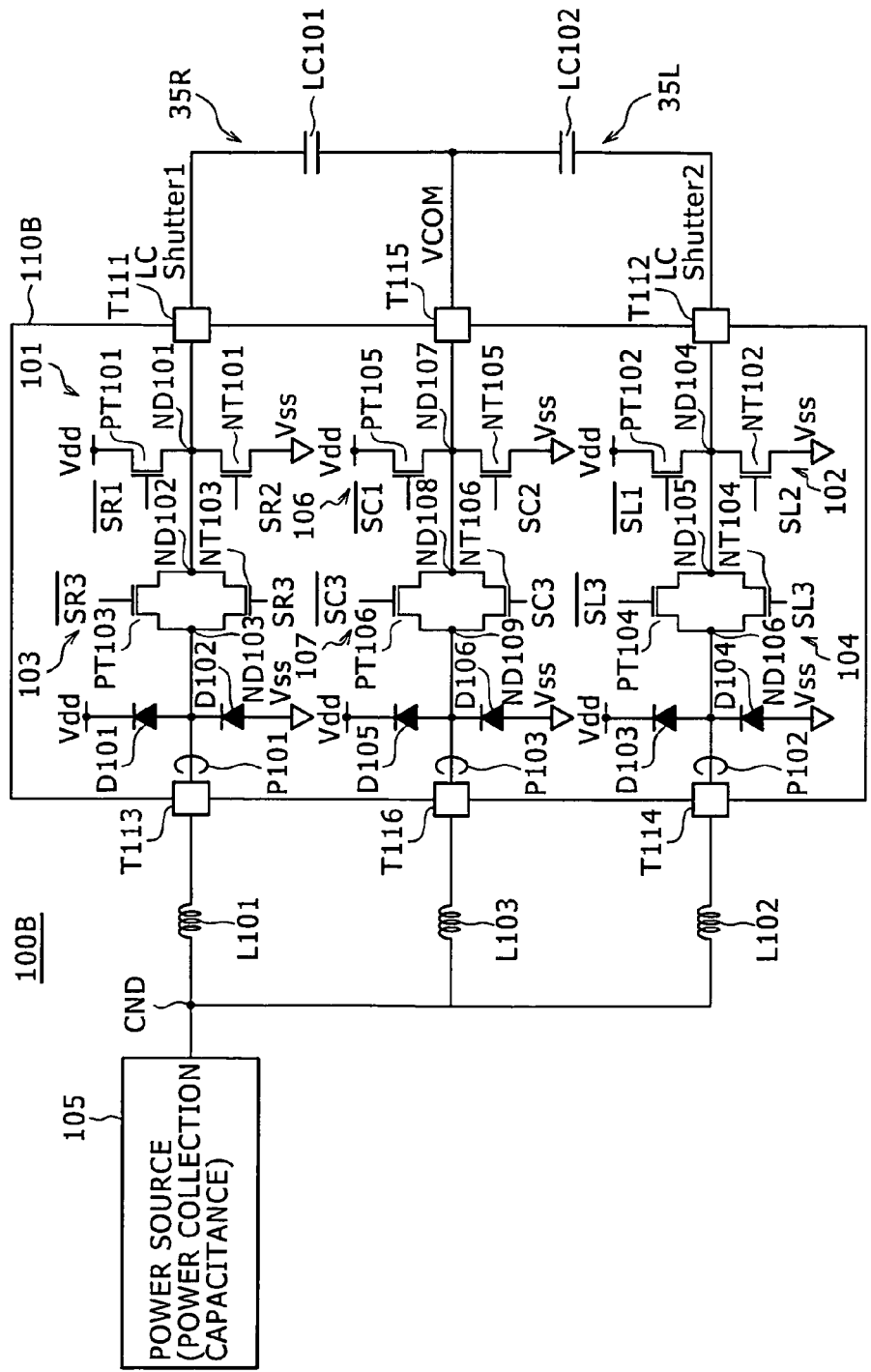
FIG. 10 is a circuit diagram showing a configuration of a shutter drive unit according to a fourth embodiment of the present invention.

FIG. 10 is a circuit diagram showing a configuration of a shutter drive unit according to a fourth embodiment of the present invention.

Figure 11:
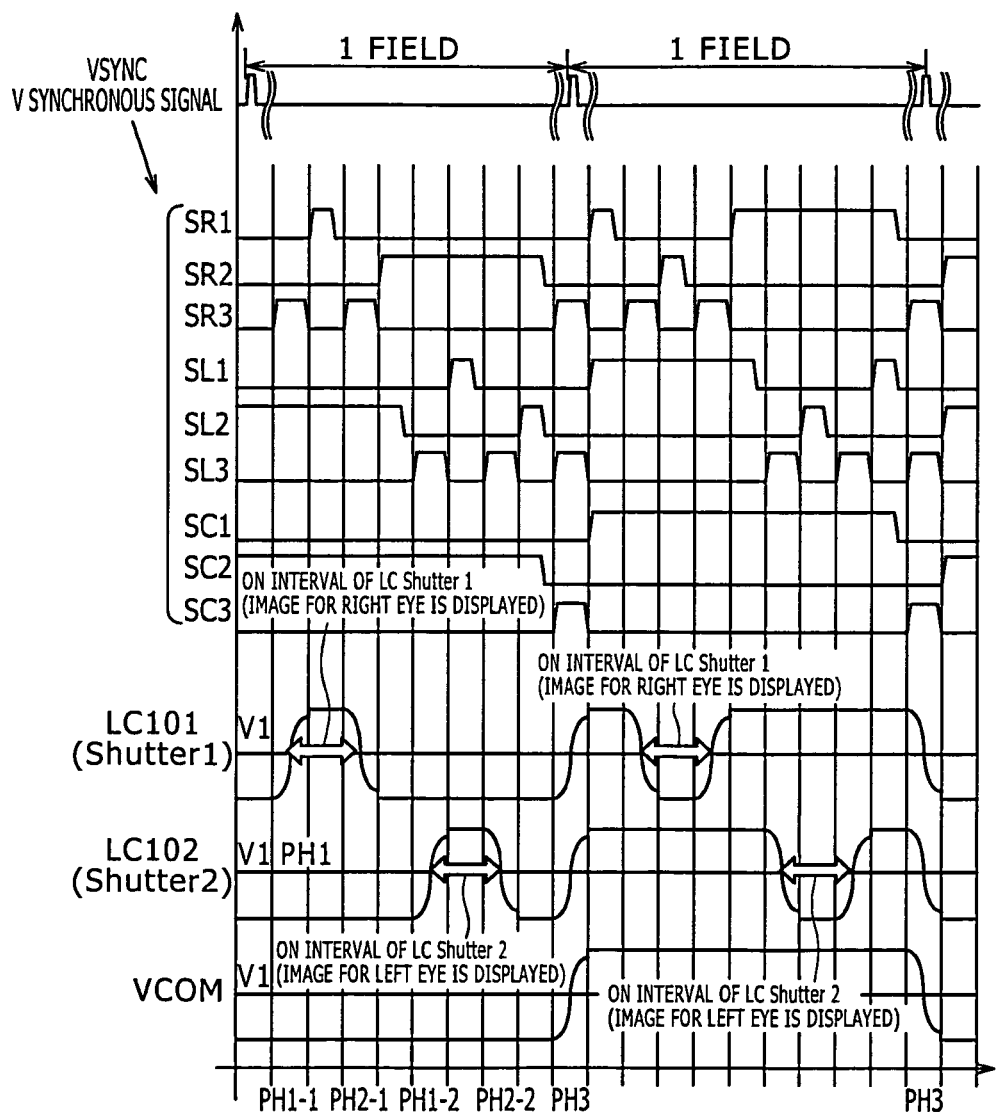
FIG. 11 is a timing chart explaining an operation of the shutter drive unit according to the fourth embodiment of the present invention when inversion drive of a common potential is supposed.

FIG. 11 is a timing chart explaining an operation of the shutter drive unit according to the fourth embodiment of the present invention when inversion drive of a common potential is supposed.

The shutter drive unit 100B according to the fourth embodiment of the present invention is different from the shutter drive unit 100 according to the second embodiment of the present invention in the following points.

That is to say, the shutter drive unit 100B according to the fourth embodiment of the present invention adopts the inversion drive, for each one field period of time of a common voltage VCOM, which is carried out for reducing the power consumption with liquid crystal driving.

Also, with the shutter drive unit 100B according to the fourth embodiment of the present invention, even in the inversion drive for the common voltage, the use of the same power collecting configuration as that in the second embodiment makes it possible to largely reduce the power consumption.

In response thereto, in addition to the configuration of the shutter drive unit 100 of the second embodiment, the following configuration is added to the shutter drive unit 100B of the fourth embodiment.

That is to say, a third inductor L103, a third drive path P103, a third clamping circuit 106, and a third switch 107 are newly added to the shutter drive unit 100B.

Connection nodes ND107, ND108 and ND109 are formed in the order from the connection end side between the other end of the first drive object capacitive load LC101, and the other end of the second drive object capacitive load LC102 in the third drive path P103.

In the shutter drive unit 100B, in addition to the configuration of the shutter drive unit 100 shown in FIG. 5, a part of the third drive path P103, the third clamping circuit 106, and the third switch 107 are configured in the form of an IC, and is formed as a driver IC 110B.

The driver IC 110B has connection terminals T115 and T116 in addition to the connection terminals T111, T112, T113 and T114.

The connection terminal T115 functions as a supply terminal for the common voltage VCOM which is inverted in polarity every field, and is connected to each of the other end of the first drive object capacitive load LC101, and the other end of the second drive object capacitive load LC102.

One end side of the third drive path P103 including the connection node ND109, and one end side of the third inductor L103 are each connected to the connection terminal T116.

It is noted that in the fourth embodiment of the present invention, the reference potential Vss (for example, the GND level) and the power source potential Vdd are alternately set as the common voltage VCOM every one field.

The third clamping circuit 106 is connected to the connection node ND107. Thus, the third clamping circuit 106 is controlled in such a way that the other ends of the first drive object capacitive load LC101 and the second drive object capacitive load LC102 can be clamped either to the power source potential Vdd level or to the reference potential Vss level.

The third clamping circuit 106 is composed of a PMOS transistor PT105 and an NMOS transistor NT105 each serving as a switch.

A source terminal of the PMOS transistor PT105 is connected to the power source Vdd and a drain terminal thereof is connected to the connection node ND107 of the third drive path P103.

A source terminal of the NMOS transistor NT103 is connected to the reference potential Vss and a drain terminal thereof is connected to the connection node ND107 of the third drive path P103.

The PMOS transistor PT105 is turned ON or OFF in accordance with the inverted signal /SC1 (the mark "/" represents the inversion) of the signal SC1 supplied to a gate terminal thereof.

The NMOS transistor NT105 is turned ON or OFF in accordance with the signal SC2 supplied to a gate terminal thereof.

The third switch 107 is disposed in the third drive path P103 extending between a position, in the third clamping circuit 106, for potential connection to the third drive path P103, and one end of the third inductor L103.

That is to say, the third switch 107 is connected between the node ND 108 and the node ND109 of the third drive path P103.

ON/OFF of the third switch 107 is controlled in such a way that connection and non-connection between the third inductor L103 and each of the other ends of the first and second drive object capacitive loads LC101 and LC102 can be switched over to each other.

The third switch 107 is configured in the form of a transmission gate in which the drain terminal of the PMOS transistor PT106 and the source terminal of the NMOS transistor NT106 are connected to each other, and the source terminal of the PMOS transistor PT106 and the drain terminal of the NMOS transistor NT106 are connected to each other.

That is to say, the drain terminal of the PMOS transistor PT106 and the source terminal of the NMOS transistor NT106 are connected to the connection node ND108, and the source terminal of the PMOS transistor PT106 and the drain terminal of the NMOS transistor NT106 are each connected to the connection node ND109.

Also, the gate terminal of the PMOS transistor PT106 is connected to a supply line of an inverted signal /SC3 of a signal SC3, and the gate terminal of the NMOS transistor NT106 is connected to a supply line of the signal SC3.

In addition, in the shutter drive unit 100B of the fourth embodiment, similarly to the case of the shutter drive unit 100A of the third embodiment, diodes are connected between the first drive path P101 and each of the power source potential Vdd and the reference potential Vss, between the second drive path P102 and each of the power source potential Vdd and the reference potential Vss, and between the third drive path P103 and each of the power source potential Vdd and the reference potential Vss, respectively.

The diodes D101 and D102 are each connected to the first drive path P101.

The anode terminal of the diode D101 is connected to the first drive path P101, and the cathode terminal thereof is connected to the power source potential Vdd.

The cathode terminal of the diode D102 is connected to the first drive path P101, and the anode terminal thereof is connected to the reference potential Vss.

The diodes D103 and D104 are each connected to the second drive path P102.

The anode terminal of the diode D103 is connected to the second drive path P102, and the cathode terminal thereof is connected to the power source potential Vdd.

The cathode terminal of the diode D104 is connected to the second drive path P102, and the anode terminal thereof is connected to the reference potential Vss.

The diodes D105 and D106 are each connected to the third drive path P103.

An anode terminal of the diode D105 is connected to the third drive path P103, and a cathode terminal of the diode D105 is connected to the power source potential Vdd.

A cathode terminal of the diode D106 is connected to the third drive path P103, and an anode terminal of the diode D106 is connected to the reference potential Vss.

Since the basic operation in this case is also the same as that in the second embodiment except that the inversion drive is carried out every one field period of time for the common voltage VCOM which is carried out for reducing the power consumption with the liquid crystal driving, a detailed description thereof is omitted here for the sake of simplicity.

However, when the common voltage VCOM is switched, the third switch 107 is turned ON in terms of a third phase PH3, and thus the control for movement of the electric charges (the control for either injection or collection of the electric charges) through the third drive path P103 is carried out.

In addition, for the period of time except for the switching period of time, the control is carried out in such a way that the third clamping circuit 106 clamps each of the other end of the first drive object capacitive load LC101, and the other end of the second drive object capacitive load LC102 either to the reference potential or to the power source potential.

As set forth hereinabove, according to the embodiment described above, the following effects can be obtained.

The addition of the power collecting function to the driver for driving the liquid crystal of the 3D eyeglasses makes it possible to realize the reduction of the power consumption, and thus to largely increase the operating time in terms of the set.

The reduction of the number of terminals results in that the reduction (PKG) of the cost can be realized.

The inductor as the external component is shared, whereby the reduction of the number of components or parts, and the reduction (set) of the cost both become possible.

The reduction of the impedance results in that it is possible to enhance the power collection efficiency, and thus it is possible to increase the operating time in terms of the set.

It is possible to suppress the increase in chip size, and thus it is possible to reduce the chip cost.

The present application contains subject matter related to that disclosed in Japanese Priority Patent Application JP 2009-203130 filed in the Japan Patent Office on Sep. 2, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A shutter drive unit, comprising:
   at least one inductor;
   a first drive path connected to said at least one inductor;
   a second drive path connected to said at least one inductor;
   a first shutter including a first drive object capacitive load;
   a second shutter including a second drive object capacitive load;
   a first clamping circuit adapted to clamp said first drive object capacitive load either to a power source potential or to a reference potential through said first drive path;
   a second clamping circuit adapted to clamp said second drive object capacitive load either to the power source potential or to the reference potential through said second drive path;
   a first switch adapted to switch a connection and a non-connection between said at least one inductor and said first drive object capacitive load, said first switch being disposed in said first drive path between a position, in said first clamping circuit, for potential connection to said first drive path, and said at least one inductor;
   a second switch adapted to switch a connection and a non-connection between said at least one inductor and said second drive object capacitive load, said second switch being disposed in said second drive path between a position, in said second clamping circuit, for potential connection to said second drive path, and said at least one inductor; and a power collecting portion configured to apply an intermediate voltage between the power source potential and the reference potential to said at least one inductor, and to collect a power.

2. The shutter drive unit according to claim 1, further comprising:

a control portion configured to control clamping operations of said first clamping circuit and said second clamping circuit, and switching operations of said first switch and said second switch, wherein said control portion includes a first phase in which electric charges are supplied from said power collecting portion either to said first drive object capacitive load or to said second drive object capacitive load, a second phase in which electric charges either in said first drive object capacitive load or in said second drive object capacitive load are collected to said power collecting portion, and an ON/OFF period of time for which said first shutter and said second shutter are turned ON or OFF between the first phase and the second phase, said control portion carries out control in such a way that said first switch and said second switch are each held in an ON state in each of the first phase and the second phase, and said control portion carries out control in such a way that for the ON/OFF period of time, said first switch and said second switch are each held in an OFF state, and either said first clamping circuit or said second clamping circuit carries out the clamping operation for clamping either said first drive object capacitive load or said second drive object capacitive load either to the power source potential or to the reference potential.

3. The shutter drive unit according to claim 2, wherein said control portion carries out control for said first drive object capacitive load and said second drive object capacitive load in the first phase, control for the ON/OFF period of time, and control in the second phase for one field period of time of an image.

4. The shutter drive unit according to claim 3, wherein said control portion carries out individually the control for said first drive object capacitive load and said second drive object capacitive load in the first phase, the control for the ON/OFF period of time, and the control in the second phase.

5. The shutter drive unit according to claim 3, further comprising:

a first inductor; and a second inductor, wherein said first inductor is connected between said first switch and said power collecting portion, said second inductor is connected between said second switch and said power collecting portion, said control portion is configured to control the first phase is expressed the first phase for said first drive object capacitive load and the second phase for said second drive object capacitive load in parallel, and said control portion is configured to control the first phase for said second drive object capacitive load and the second phase for said first drive object capacitive load in parallel therewith.

6. The shutter drive unit according to claim 5, wherein said control portion controls said first clamping circuit and said second clamping circuit in such a way that said first clamping circuit and said second clamping circuit carry out clamping operations for clamping said first drive object capacitive load and said second drive object capacitive load to corresponding ones of the power source potential and the reference potential in a complementary style.

7. The shutter drive unit according to claim 6, wherein said control portion controls said first clamping circuit and said second clamping circuit so as to clamp said second drive object capacitive load to the reference potential when said first drive object capacitive load is clamped to the power source potential; and said control portion controls said first clamping circuit and said second clamping circuit so as to clamp said second drive object capacitive load to the power source potential when said first drive object capacitive load is clamped to the reference potential.

8. The shutter drive unit according to claim 2, wherein one end of said first drive object capacitive load is connected to a side of said first drive path;

one end of said second drive object capacitive load is connected to a side of said second drive path; and a common voltage in which the reference potential and the power source potential are alternately switched over to each other every one field is supplied to each of the other end of said first drive object capacitive load, and the other end of said second drive object capacitive load.

9. The shutter drive unit according to claim 8, further comprising:

a third drive path connected to said at least one inductor;

a third clamping circuit adapted to clamp each of the other end of said first drive object capacitive load, and the other end of said second drive object capacitive load either to the reference potential or to the power source potential; and a third switch adapted to switch connection and non-connection between said at least one inductor and each of said first drive object capacitive load and said second drive object capacitive load over to each other, said third switch being disposed in said third drive path extending between a position, in said third clamping circuit, for potential connection to said third drive path, and said at least one inductor.

10. The shutter drive unit according to claim 9, wherein said control portion turns ON said third switch when the common voltage is switched every one field, thereby carrying out control for movement of the electric charges, and carries out control in such a way that for a period of time except for a switching period of time, said third clamping circuit clamps each of the other end of said first drive object capacitive load, and the other end of said second drive object capacitive load either to the reference potential or to the power source potential.

11. The shutter drive unit according to claim 9, further comprising:

a first inductor;

a second inductor; and a third inductor, wherein said first inductor is connected between said first switch and said power collecting portion, said second inductor is connected between said second switch and said power collecting portion, and said third inductor is connected between said third switch and said power collecting portion.

12. A three-dimensional image display system, comprising:
- an image display apparatus including a display device; and
- three-dimensional eyeglasses including a shutter drive unit configured to drive a first shutter and a second shutter, said three-dimensional eyeglasses visually recognizing said display device, thereby obtaining a three-dimensional stereoscopic image;
- said image display apparatus including a communication portion adapted to transmit a synchronous signal for an image to said three-dimensional eyeglasses;
- said three-dimensional eyeglasses including
  - a communication portion adapted to receive the synchronous signal transmitted thereto from said communication portion of said image display apparatus, and
  - a control portion configured to control drive for said shutter drive unit at a timing synchronous with the synchronous signal received; and
- said shutter drive unit including
  - at least one inductor,
  - a first drive path connected to said at least one inductor,
  - a second drive path connected to said at least one inductor,
  - a first shutter including a first drive object capacitive load,
  - a second shutter including a second drive object capacitive load,
  - a first clamping circuit adapted to clamp said first drive object capacitive load either to a power source potential or to a reference potential through said first drive path,
  - a second clamping circuit adapted to clamp said second drive object capacitive load either to the power source potential or to the reference potential through said second drive path,
  - a first switch adapted to switch a connection and a non-connection between said at least one inductor and said first drive object capacitive load, said first switch being disposed in said first drive path between a position, in said first clamping circuit, for potential connection to said first drive path, and said at least one inductor,
  - a second switch adapted to switch a connection and a non-connection between said at least one inductor and said second drive object capacitive load, said second switch being disposed in said second drive path between a position, in said second clamping circuit, for potential connection to said second drive path, and said at least one inductor, and
  - a power collecting portion configured to apply an intermediate voltage between the power source potential and the reference potential to said at least one inductor, and to collect a power.

13. The three-dimensional image display system according to claim 12, wherein
- said control portion is configured to control clamping operations of said first clamping circuit and said second clamping circuit, and switching operations of said first switch and said second switch;
- said control portion includes
  - a first phase in which electric charges are supplied from said power collecting portion either to said first drive object capacitive load or to said second drive object capacitive load,
  - a second phase in which electric charges either in said first drive object capacitive load or in said second drive object capacitive load are collected to said power collecting portion, and
  - an ON/OFF period of time for which said first shutter and said second shutter are turned ON or OFF between the first phase and the second phase;
- said control portion carries out control in such a way that said first switch and said second switch are each held in an ON state in each of the first phase and the second phase; and
- said control portion carries out control in such a way that for the ON/OFF period of time, said first switch and said second switch are each held in an OFF state, and either said first clamping circuit or said second clamping circuit carries out the clamping operation for clamping either said first drive object capacitive load or said second drive object capacitive load either to the power source potential or to the reference potential.

14. The three-dimensional image display system according to claim 13, wherein said control portion carries out control for said first drive object capacitive load and said second drive object capacitive load in the first phase, control for the ON/OFF period of time, and control in the second phase for one field period of time of an image.

15. A shutter drive unit, comprising:
- an inductor configured to connect to a first drive path leading to a first shutter and a second drive path leading to a second shutter, the first and the second shutters configured to respectively include first and second object loads;
- a power collecting portion configured to collect a power through the inductor from the first and the second shutters, by being configured to:
  - supply in a first phase electric charges to one of the first object load and the second object load while a charge is collected from the other of the first object load and the second object load, and
  - supply in a second phase electric charges to the other of the first object load and the second object load while a charge is collected from the one of the first object load and the second object load.

16. A three-dimensional image display system comprising the shutter drive unit according to claim 15.

* * * * *